(12) United States Patent  (10) Patent No.: US 12,538,790 B2
Lai  (45) Date of Patent: Jan. 27, 2026

(54) ELECTRICAL STRUCTURE AND METHOD OF MANUFACTURING THE SAME

(71) Applicant: NANYA TECHNOLOGY CORPORATION, New Taipei (TW)

(72) Inventor: Jen-I Lai, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 354 days.

(21) Appl. No.: 18/232,831

(22) Filed: Aug. 11, 2023

(65) Prior Publication Data

US 2025/0054862 A1  Feb. 13, 2025

(51) Int. Cl.
*H01L 23/528* (2006.01)
*H10D 64/68* (2025.01)

(52) U.S. Cl.
CPC ....... *H01L 23/5283* (2013.01); *H10D 64/681* (2025.01)

(58) Field of Classification Search
CPC .......... H01L 23/5283; H01L 21/28518; H01L 21/76805; H01L 21/76814; H01L 23/485; H01L 23/5226; H10D 64/681; H10D 30/60; H10D 64/256; H10D 64/62; H10B 12/50; H10B 12/01
See application file for complete search history.

(56) References Cited

U.S. PATENT DOCUMENTS

| | | | | |
|---|---|---|---|---|
| 2005/0140017 A1* | 6/2005 | Baek | ................... | H01L 21/0271 257/E21.026 |
| 2005/0275111 A1* | 12/2005 | Hsieh | ................... | H01L 23/544 257/E23.179 |
| 2013/0049219 A1* | 2/2013 | Tsai | .................. | H01L 21/76802 257/774 |
| 2021/0398879 A1* | 12/2021 | Huang | ............. | H01L 21/76802 |

FOREIGN PATENT DOCUMENTS

| | | |
|---|---|---|
| TW | 200503111 A | 1/2005 |
| TW | 200511545 A | 3/2005 |
| TW | 200723375 | 6/2007 |
| TW | 200723375 A | 6/2007 |
| TW | 200805565 A | 1/2008 |
| TW | 202211405 A | 3/2022 |
| TW | 202308040 A | 2/2023 |

OTHER PUBLICATIONS

Office Action and Search Report mailed on Jun. 4, 2024 related to Taiwanese Application No. 112135744.
Office Action and Search Report mailed on Oct. 9, 2024 related to Taiwanese Application No. 113112712.

* cited by examiner

*Primary Examiner* — Syed I Gheyas
(74) *Attorney, Agent, or Firm* — Xuan Zhang

(57) ABSTRACT

An electrical structure and a method of manufacturing an electrical structure are provided. The electrical structure includes a substrate, a first insulation layer, a second insulation layer and an electrical contact. The first insulation layer and the second insulation layer are disposed over the (Continued)

substrate. The electrical contact extends through the first insulation layer and the second insulation layer. The electrical contact includes a first portion disposed in the first insulation layer and a second portion disposed in the second insulation layer. The first portion has a first width, and the second portion has a second width. A ratio of a difference between the first width and the second width to the first width is less than 10%.

14 Claims, 10 Drawing Sheets

ELECTRICAL STRUCTURE AND METHOD OF MANUFACTURING THE SAME

TECHNICAL FIELD

The present disclosure relates to an electrical structure and a method of manufacturing the same, and more particularly, to an electrical structure including an electrical contact, and a method of manufacturing the same.

DISCUSSION OF THE BACKGROUND

Semiconductor structures are used in a variety of electronic applications, and the dimensions of semiconductor structures are continuously being scaled down to meet the current application requirements. However, a variety of issues arise during the scaling-down process and impact the final electrical characteristics, quality, cost and yield. Typical memory devices (such as dynamic random access memory (DRAM) devices) include electrical contacts for electrically interconnecting different elements. A profile of the electrical contact is a critical concern since it influences a contact resistance and an electron current transmission speed.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides an electrical structure including a substrate, a first insulation layer, a second insulation layer and an electrical contact. The first insulation layer is disposed over a first surface of the substrate. The second insulation layer is disposed on the first insulation layer. The electrical contact extends through the first insulation layer and the second insulation layer to electrically connect the first surface of the substrate. The electrical contact includes a first portion disposed in the first insulation layer and a second portion disposed in the second insulation layer. The first portion has a first width, and the second portion has a second width. A ratio of a difference between the first width and the second width to the first width is less than 10%.

Another aspect of the present disclosure provides an electrical structure including a substrate, a first insulation layer, a second insulation layer and an electrical contact. The first insulation layer is disposed over a first surface of the substrate, and defines a first through hole extending through the first insulation layer. The first through hole has a first width. The second insulation layer is disposed on the first insulation layer and defines a second through hole extending through the second insulation layer. The second through hole has a second width. A difference between the first width and the second width is less than one tenth of the first width. An electrical contact is disposed in the first through hole and the second through hole, and is electrically connected to the first surface of the substrate.

Another aspect of the present disclosure provides a method of a stacked structure including a substrate, a first insulation layer and a second insulation layer stacked on one another. The method also includes forming a first hole structure to extend through the first insulation layer and the second insulation layer and expose a portion of the substrate. The method also includes cleaning the exposed portion of the substrate through a cleaning agent so as to enlarge the first hole structure to become a second hole structure, wherein the cleaning agent includes water and hydrofluoric acid (HF), and a weight ratio of water to HF is between 500:1 and 2500:1. The method also includes forming an electrical contact in the second hole structure.

By using the ultra-dilute hydrofluoric acid (HF), an electrical contact having an improved profile is formed.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
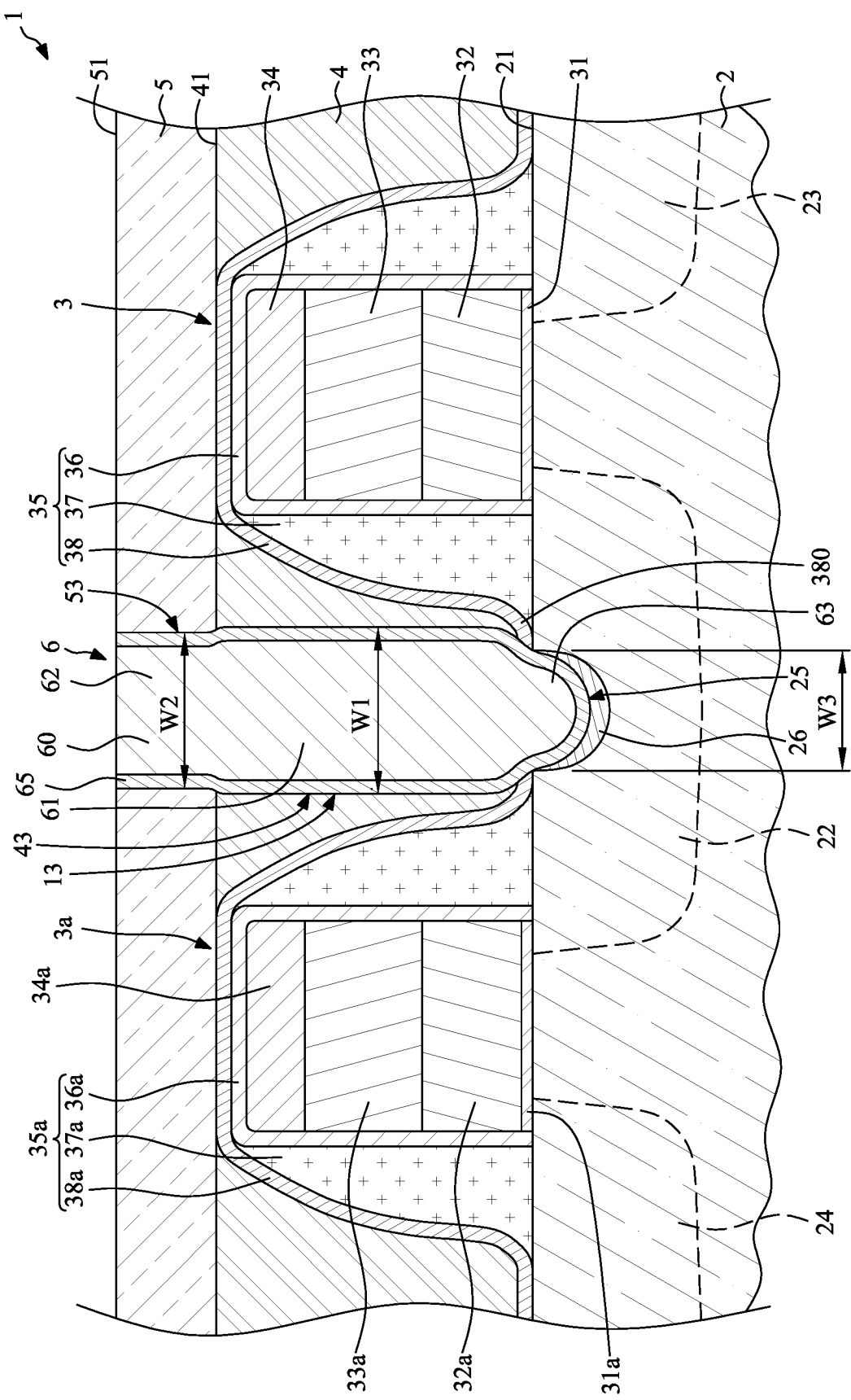
FIG. 1 is a schematic cross-sectional view of an electrical structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of an electrical structure 1 in accordance with some embodiments of the present disclosure. In some embodiments, the electrical structure 1 may be a semiconductor structure or a semiconductor device that includes a circuit, such as a memory cell. In some embodiments, the memory cell may include a dynamic random access memory cell (DRAM cell). In some embodiments, the electrical structure 1 may be an interconnection structure.

In addition, the electrical structure 1 may be or include a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

The electrical structure 1 may include a substrate 2 (e.g., a semiconductor substrate), a first metal-oxide-semiconductor (MOS) transistor 3, a second MOS transistor 3a, a first insulation layer 4, a second insulation layer 5 and an electrical contact 6.

In some embodiments, the substrate 2 may have a first surface 21 (e.g., a top surface). The substrate 2 may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 2 may include a semiconductor-on-insulator substrate, such as a silicon-on-insulator (SOI) substrate, a silicon germanium-on-insulator (SGOI) substrate, or a germanium-on-insulator (GOI) substrate.

Depending on the IC fabrication stage, the substrate 2 may include various material layers (e.g., dielectric layers, semiconductor layers, and/or conductive layers) configured to form IC features (e.g., doped regions, isolation features, gate features, source/drain features, interconnect features, other features, or combinations thereof).

As shown in FIG. 1, the substrate 2 may include a drain electrode 22, a source electrode 23 and a source electrode 24. The substrate 2 may define a recess portion 25 recessed from the first surface 21 (e.g., the top surface) of the substrate 2. The recess portion 25 may be disposed in the drain electrode 22. The recess portion 25 has a third width W3. The third width W3 may be the maximum width of the recess portion 25. In addition, the substrate 2 may include a low resistance layer 26 disposed on a bottom wall of the recess portion 25. The low resistance layer 26 may include cobalt (Co) such as cobalt disilicide ($CoSi_2$).

The first MOS transistor 3 and the second MOS transistor 3a may be may be a portion of a word line. The first MOS transistor 3 and the second MOS transistor 3a may be disposed on the first surface 21 of the substrate 2. The first MOS transistor 3 may correspond to the drain electrode 22 and the source electrode 23. The first MOS transistor 3 may include a gate oxide layer 31, a first gate conductor layer 32, a second gate conductor layer 33, an upper layer 34 and a spacer 35. The gate oxide layer 31 may be disposed on the first surface 21 of the substrate 2, and may include an oxide material for electrical insulation. The first gate conductor layer 32 may be disposed on the gate oxide layer 31, and may include a polysilicon material. The second gate conductor layer 33 may be disposed on the first gate conductor layer 32, and may include a tungsten silicide (WSix) material. The first gate conductor layer 32 and the second gate conductor layer 33 may be collectively formed a gate electrode. The upper layer 34 may be disposed on the second gate conductor layer 33, and may include a nitride material. In some embodiments, the gate electrode may include the upper layer 34.

The spacer 35 may surround the gate electrode (including, e.g., the first gate conductor layer 32 and the second gate conductor layer 33) or may be disposed around the gate electrode. In some embodiments, the spacer 35 may include a first layer 36, a second layer 37 and a third layer 38. The first layer 36 may cover the gate oxide layer 31, the first gate conductor layer 32, the second gate conductor layer 33 and the upper layer 34, and may include a nitride material. The second layer 37 may be disposed on a lateral surface of the first layer 36 and on a portion of the first surface 21 of the substrate 2. The second layer 37 and may taper upward, and may include an oxide material. The third layer 38 may cover the first layer 36 and the second layer 37. For example, the third layer 38 may cover the outer surface of the first layer 36 and the top surface of the second layer 37. Thus, the second layer 37 may be sandwiched between the first layer 36 and the third layer 38. A bottom end of the third layer 38 may be disposed on the first surface 21 of the substrate 2.

Similarly, the second MOS transistor 3a may correspond to the drain electrode 22 and the source electrode 24. The second MOS transistor 3a may include a gate oxide layer 31a, a first gate conductor layer 32a, a second gate conductor layer 33a, an upper layer 34a and a spacer 35a. The gate oxide layer 31a, the first gate conductor layer 32a, the second gate conductor layer 33a, the upper layer 34a and the spacer 35a of the second MOS transistor 3a may be same as the gate oxide layer 31, the first gate conductor layer 32, the second gate conductor layer 33, the upper layer 34 and the spacer 35 of the first MOS transistor 3, respectively.

The gate oxide layer 31a may be disposed on the first surface 21 of the substrate 2, and may include an oxide material for electrical insulation. The first gate conductor layer 32a may be disposed on the gate oxide layer 31a, and may include a polysilicon material. The second gate conductor layer 33a may be disposed on the first gate conductor layer 32a, and may include a tungsten silicide (WSix) material. The first gate conductor layer 32a and the second gate conductor layer 33a may be collectively formed a gate electrode. The upper layer 34a may be disposed on the second gate conductor layer 33a, and may include a nitride material. In some embodiments, the gate electrode may include the upper layer 34a.

The spacer 35a may surround the gate electrode (including, e.g., the first gate conductor layer 32a and the second gate conductor layer 33a) or may be disposed around the gate electrode. In some embodiments, the spacer 35a may include a first layer 36a, a second layer 37a and a third layer 38a. The first layer 36a may cover the gate oxide layer 31a, the first gate conductor layer 32a, the second gate conductor layer 33a and the upper layer 34a, and may include a nitride material. The second layer 37a may be disposed on a lateral surface of the first layer 36a and on a portion of the first surface 21 of the substrate 2. The second layer 37a and may taper upward, and may include an oxide material. The third layer 38a may cover the first layer 36a and the second layer 37a. For example, the third layer 38a may cover the outer surface of the first layer 36a and the top surface of the second layer 37a. Thus, the second layer 37a may be sandwiched between the first layer 36a and the third layer 38a. A bottom end of the third layer 38a may be disposed on the first surface 21 of the substrate 2.

The first insulation layer 4 may be disposed over the first surface 21 of the substrate 2. In some embodiments, the first insulation layer 4 may be disposed on the first surface 21 of the substrate 2, and may cover the first MOS transistor 3 and the second MOS transistor 3a. The first insulation layer 4 may include an oxide material such as silicon dioxide ($SiO_2$). A first surface 41 (e.g., a top surface) of the first insulation layer 4 may be aligned with a top surface of the third layer 38 of the first MOS transistor 3 and a top surface of the third layer 38a of the second MOS transistor 3a. Thus, the top surface of the third layer 38 of the first MOS transistor 3 and the top surface of the third layer 38a of the second MOS transistor 3a may be exposed from the first surface 41 of the first insulation layer 4.

The first insulation layer 4 may define a first through hole 43 extending through the first insulation layer 4. The first through hole 43 has a first width W1. The first width W1 may be the maximum width of the first through hole 43. The recess portion 25 of the substrate 2 may be in communication with the first through hole 43 of the first insulation layer 4. That is, the first through hole 43 may further extend through the connecting layer 380 (connecting the third layer 38 and the third layer 38a) covering the first surface 21 of the substrate 2. The connecting layer 380, the third layer 38 and the third layer 38a may be the same layer. The third width W3 of the recess portion 25 may be less than the first width W1 of the first through hole 43. A width of the through hole of the connecting layer 380 may taper from the first width W1 to the third width W3.

The second insulation layer 5 may be disposed on the first insulation layer 4. The second insulation layer 5 may cover and contact the first surface 41 of the first insulation layer 4. A material of the second insulation layer 5 may be different from a material of the first insulation layer 4. The second insulation layer 5 may include a nitride material such as silicon nitride ($Si_3N_4$, or SiN). The second insulation layer 5 may define a second through hole 53 extending through the second insulation layer 5. The second through hole 53 of the second insulation layer 5 may be communicated with the first through hole 43 of the first insulation layer 4 so as to form a hole structure 13 (or a contact hole). A central axis of the first through hole 43 may be substantially aligned with a central axis of the second through hole 53. Thus, the hole structure 13 may extend through the first insulation layer 4 and the second insulation layer 5, and may include the first through hole 43 and the second through hole 53. In some embodiments, the hole structure 13 may further extend into the substrate 2, and may include the recess portion 25.

The second through hole 53 has a second width W2. The second width W2 may be the maximum width of the second through hole 53. The second width W2 of the second through hole 53 may be less than the first width W1 of the first through hole 43. The third width W3 of the recess portion 25 may be less than the second width W2 of the second through hole 53.

In some embodiments, a difference between the first width W1 and the second width W2 is less than one tenth of the first width W1. That is, a ratio of (W1-W2)/W1 may be less than 0.1, 0.09, 0.08, 0.07 or 0.06. Therefore, a gap (or a tolerance) between a sidewall of the first through hole 43 and a sidewall of the second through hole 53 may be very small. The sidewall of the first through hole 43 and the sidewall of the second through hole 53 may be approximately aligned with each other.

The electrical contact 6 may be disposed in the hole structure 13, and may extend through the first insulation layer 4 and the second insulation layer 5 to electrically connect the first surface 21 of the substrate 2. In addition, the electrical contact 6 may further extend into the substrate 2. The electrical contact 6 may include a periphery layer 65 and a central material 60. The periphery layer 65 may be disposed on a sidewall of the hole structure 13, and may define a central hole. The central material 60 may fill the central hole defined by the periphery layer 65. The periphery layer 65 may include titanium nitride (TiN), and the central material 60 may include tungsten (W).

The electrical contact 6 may include a first portion 61, a second portion 62 and a third portion 63. The first portion 61 may be disposed in the first through hole 43 of the first insulation layer 4, and may have a first width W1. It is noted that the first width W1 of the first portion 61 may be a maximum width of the first portion 61, and may be substantially equal to the first width W1 of the first through hole 43 of the first insulation layer 4. The first portion 61 may include a portion of the periphery layer 65 and a portion of the central material 60.

The second portion 62 may be disposed in the second through hole 53 of the second insulation layer 2, and may have a second width W2. It is noted that the second width W2 of the second portion 62 may be a maximum width of the second portion 62, and may be substantially equal to the second width W2 of the second through hole 53 of the second insulation layer 5. The second portion 62 may include a portion of the periphery layer 65 and a portion of the central material 60. A ratio of a difference between the first width W1 and the second width W2 to the first width W1 may be less than 10%. That is, a ratio of (W1-W2)/W1 may be less than 10%, 9%, 8%, 7% or 6%. Therefore, a gap (or a tolerance) between a sidewall of the first portion 61 and a sidewall of the second portion 62 may be very small. The sidewall of the first portion 61 and the sidewall of the second portion 62 may be approximately aligned with each other.

The third portion 63 may be disposed in the recess portion 25 of the substrate 2, and may have a third width W3. It is noted that the third width W3 of the third portion 63 may be a maximum width of the third portion 63, and may be substantially equal to the third width W3 of the recess portion 25 of the substrate 2. The third portion 63 may include a portion of the periphery layer 65 and a portion of the central material 60. The third width W3 may be less than the first width W1 and the second width W2. The low resistance layer 26 may be substantially conformal with the third portion 63 of the electrical contact 6.

The first portion 61, the second portion 62 and the third portion 63 of the electrical contact 6 may be formed integrally and concurrently so that the electrical contact 6 may be a monolithic structure. The electrical contact 6 may be disposed between the first MOS transistor 3 and the second MOS transistor 3a. The electrical contact 6 may electrically connect an electrode of the first MOS transistor 3 and/or the second MOS transistor 3a. As shown in FIG. 1, the electrical contact 6 may electrically connect a common electrode (e.g., the drain electrode 22) of the first MOS transistor 3 and the second MOS transistor 3a. However, in other embodiments, the electrical contact 6 may electrically connect a first electrode of the first MOS transistor 3 and/or a second electrode of the second MOS transistor 3a. The first electrode of the first MOS transistor 3 may be different from the second electrode of the second MOS transistor 3a.

In some embodiments, the low resistance layer 26 may be disposed between the electrical contact 6 and the drain electrode 22 of the substrate 2 so as to reduce the electrical resistance of ohmic contact between the electrical contact 6 and the substrate 2. During a manufacturing process, before forming the low resistance layer 26, a portion of the substrate 2 that is exposed in a hole structure needs to be cleaned by a cleaning agent. In a comparative embodiment, the cleaning agent will cause a large difference between a first width of a first through hole in a first insulation layer and a second width of a second through hole in a second insulation layer. Thus, the hole structure may have a "bowing profile" which will result in a weak profile of an electrical contact formed in such hole structure. For example, such electrical contact may have a seam or crack readily. As shown in FIG. 1, the hole structure 13 may be formed by an embodiment illustrated below, and the difference between the first width W1 of the first through hole 43 and the second width W2 of the second through hole 53 may be reduced. Thus, the sidewall of the hole structure 13 may be substantially straight so as to facilitate the deposition process of the periphery layer 65 and the filling process of the central material 60. The electrical contact 6 may have an improved profile. The quality of the electrical contact 6 may be improved. That is, the seam or the crack may be reduced. The electrical contact 6 may be free of seaming or cracking.

FIG. 2 through FIG. 9 illustrate a method of manufacturing an electrical structure 1 according to some embodiments of the present disclosure. Referring to FIG. 2 through FIG. 5, a stacked structure 72 is provided. The stacked structure 72 may be manufactured as follows.

Figure 2:
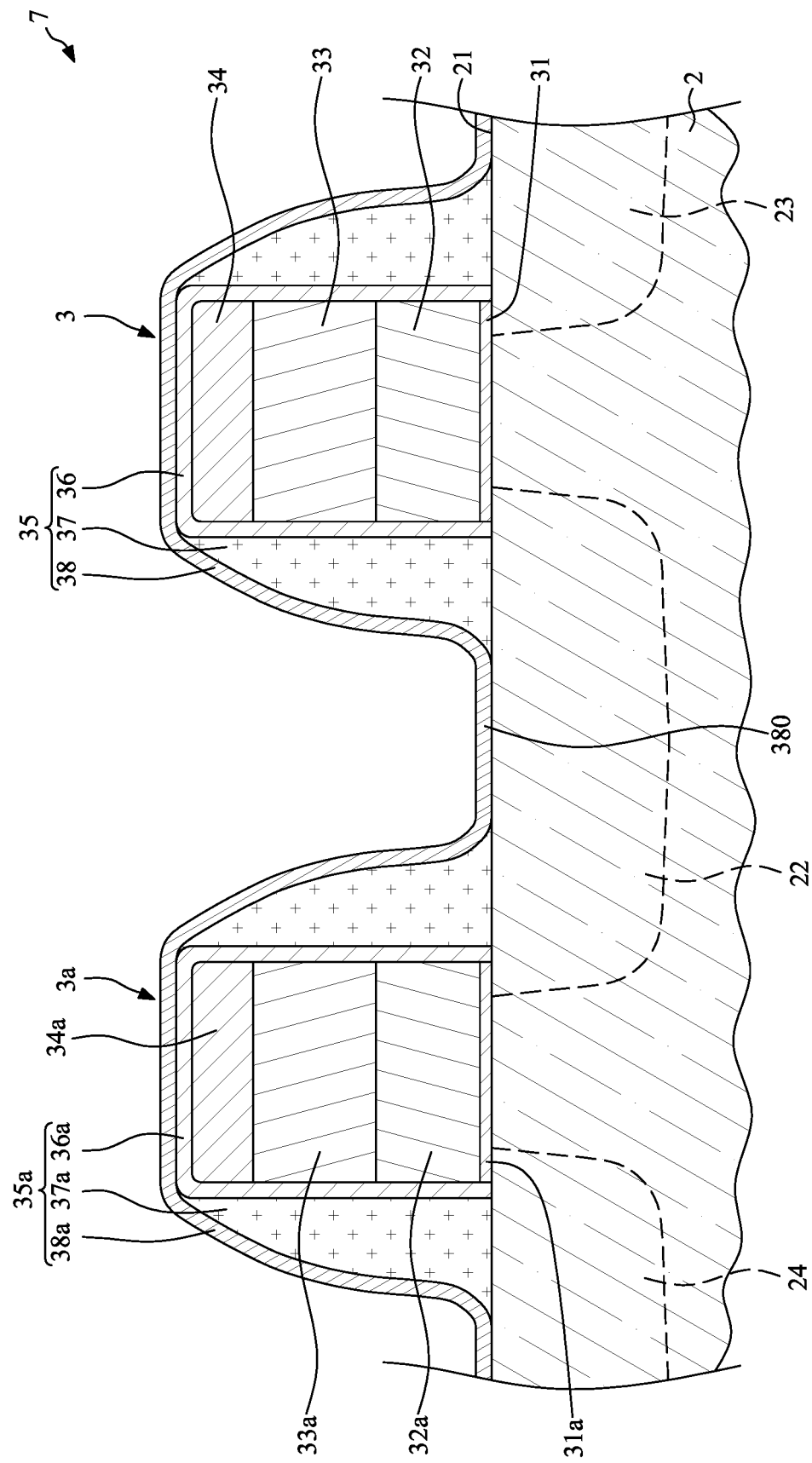
FIG. 2 illustrates one stage of a method of manufacturing an electrical structure, in accordance with some embodiments of the present disclosure.

Referring to FIG. 2, a base portion 7 is provided. The base portion 7 may include a substrate 2, a first MOS transistor 3 and a second MOS transistor 3a. The substrate 2, the first MOS transistor 3 and the second MOS transistor 3a of FIG. 2 may be same as or similar to the substrate 2, the first MOS transistor 3 and the second MOS transistor 3a of FIG. 1, respectively.

In some embodiments, the substrate 2 may have a first surface 21 (e.g., a top surface). The substrate 2 may include a drain electrode 22, a source electrode 23 and a source electrode 24. The substrate 2 may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

The first MOS transistor 3 and the second MOS transistor 3a may be formed or disposed on the first surface 21 of the substrate 2. The first MOS transistor 3 may correspond to the drain electrode 22 and the source electrode 23. The first MOS transistor 3 may include a gate oxide layer 31, a first gate conductor layer 32, a second gate conductor layer 33, an upper layer 34 and a spacer 35. The gate oxide layer 31 may be formed or disposed on the first surface 21 of the substrate 2, and may include an oxide material for electrical insulation. The first gate conductor layer 32 may be formed or disposed on the gate oxide layer 31, and may include a polysilicon material. The second gate conductor layer 33 may be formed or disposed on the first gate conductor layer 32, and may include a tungsten silicide (WSix) material. The upper layer 34 may be disposed on the second gate conductor layer 33, and may include a nitride material.

The spacer 35 may surround the gate electrode (including, e.g., the first gate conductor layer 32 and the second gate conductor layer 33) or may be disposed around the gate electrode. In some embodiments, the spacer 35 may include a first layer 36, a second layer 37 and a third layer 38. The first layer 36 may cover the gate oxide layer 31, the first gate conductor layer 32, the second gate conductor layer 33 and the upper layer 34, and may include a nitride material. The second layer 37 may be disposed on a lateral surface of the first layer 36 and on a portion of the first surface 21 of the substrate 2. The second layer 37 and may taper upward, and may include an oxide material. The third layer 38 may cover the first layer 36 and the second layer 37. For example, the third layer 38 may cover the outer surface of the second layer 37 and the top surface of the first layer 36. Thus, the second layer 37 may be sandwiched between the first layer 36 and the third layer 38. A bottom end of the third layer 38 may be disposed on the first surface 21 of the substrate 2.

Similarly, the second MOS transistor 3a may correspond to the drain electrode 22 and the source electrode 24. The structure of the second MOS transistor 3a may be same as or similar to the first MOS transistor 3, and may include a gate oxide layer 31a, a first gate conductor layer 32a, a second gate conductor layer 33a, an upper layer 34a and a spacer 35a. The gate oxide layer 31a, the first gate conductor layer 32a, the second gate conductor layer 33a, the upper layer 34a and the spacer 35a of the second MOS transistor 3a may be same as or similar to the gate oxide layer 31, the first gate conductor layer 32, the second gate conductor layer 33, the upper layer 34 and the spacer 35 of the first MOS transistor 3.

A connecting layer 380 may connect the third layer 38 and the third layer 38a, and may cover the first surface 21 of the substrate 2. The connecting layer 380, the third layer 38 and the third layer 38a may be the same layer, and may be formed concurrently.

Figure 3:
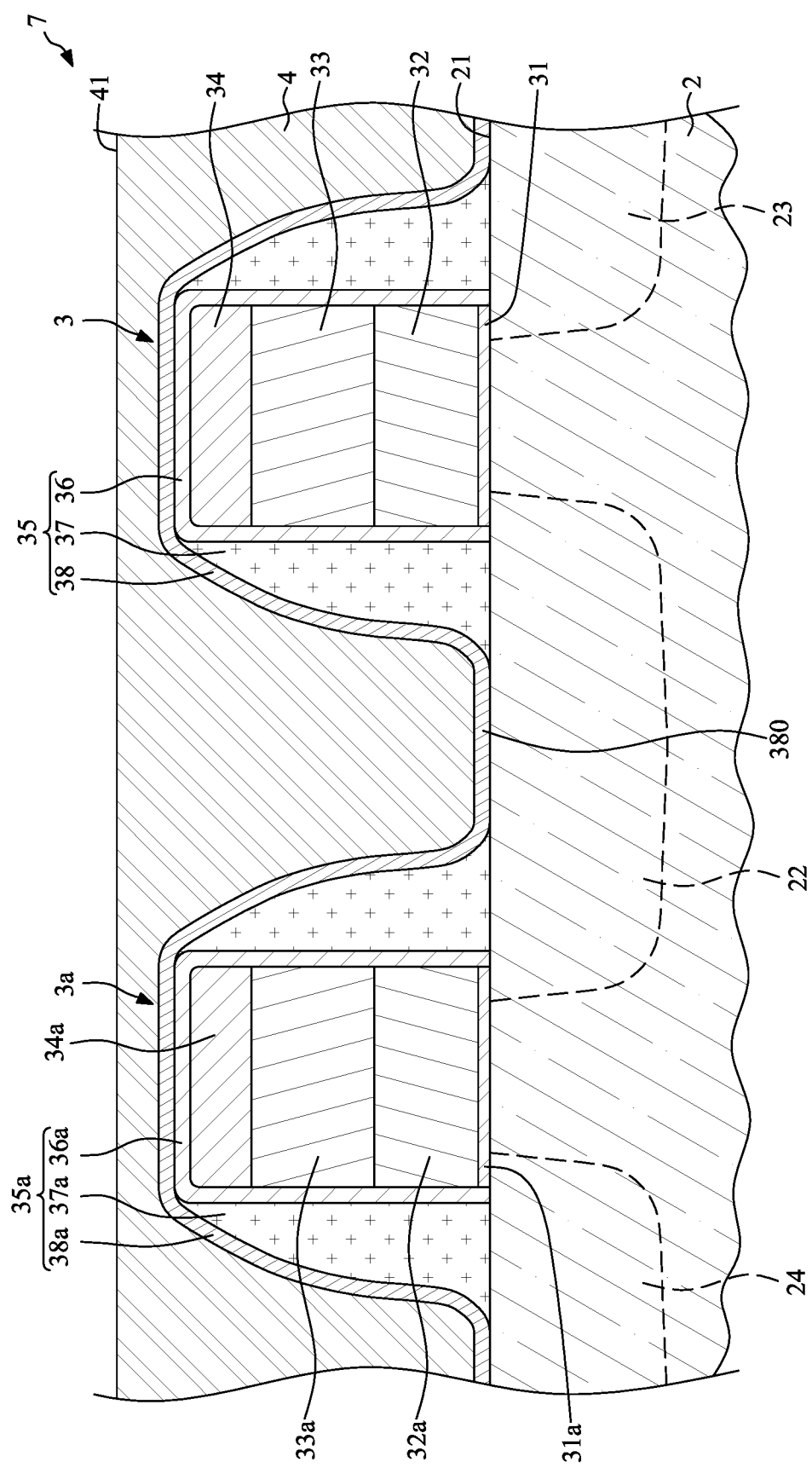
FIG. 3 illustrates one stage of a method of manufacturing an electrical structure, in accordance with some embodiments of the present disclosure.

Referring to FIG. 3, a first insulation layer 4 may be formed or disposed over the first surface 21 of the substrate 2. In some embodiments, the first insulation layer 4 may be disposed on the first surface 21 of the substrate 2, and may cover the first MOS transistor 3 and the second MOS transistor 3a. A first surface 41 (e.g., a top surface) of the first insulation layer 4 may be higher than a top surface of the third layer 38 of the first MOS transistor 3 and a top surface of the third layer 38a of the second MOS transistor 3a. Thus, the top surface of the third layer 38 of the first MOS transistor 3 and the top surface of the third layer 38a of the second MOS transistor 3a may be covered by the first insulation layer 4.

Figure 4:
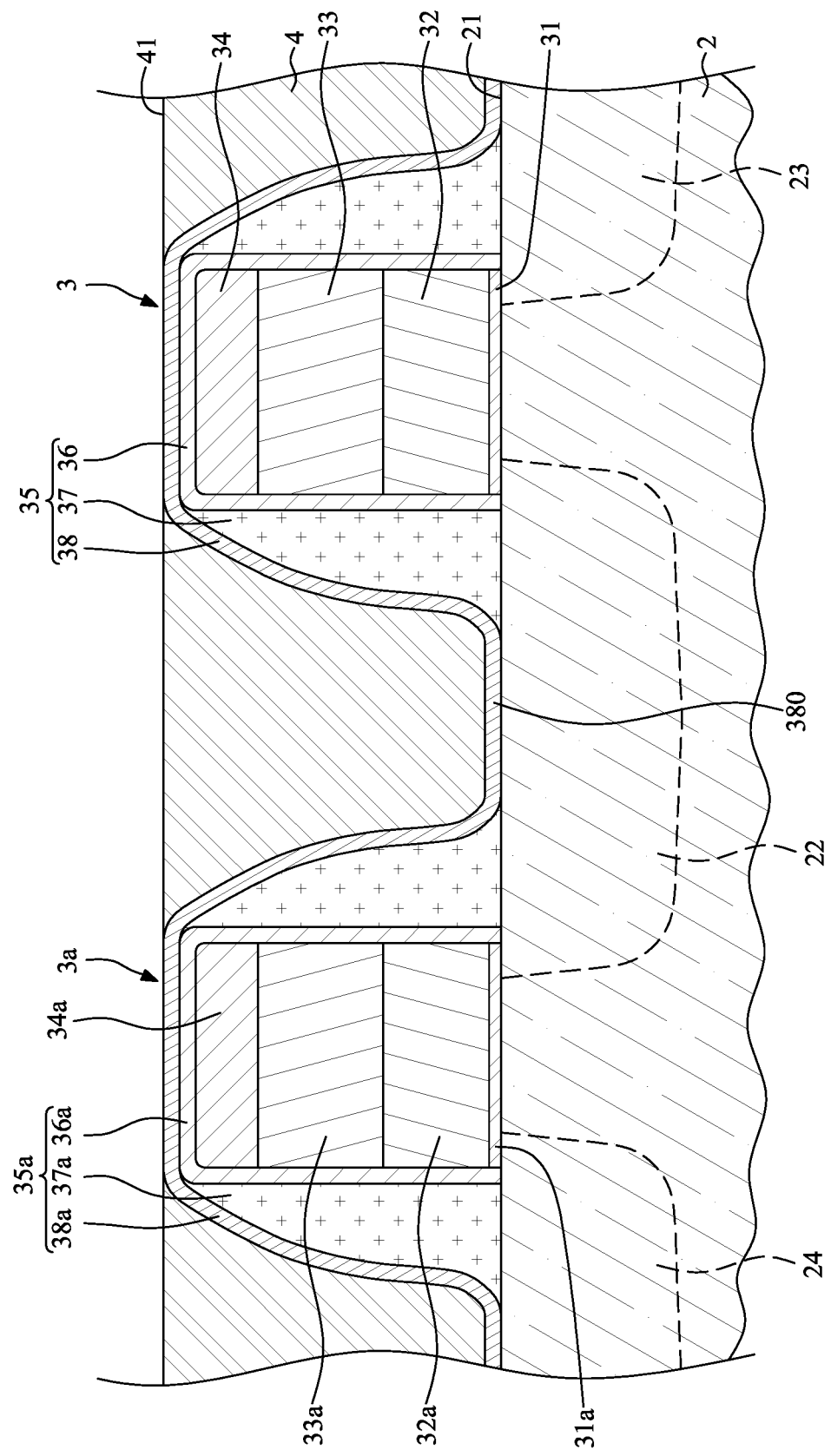
FIG. 4 illustrates one stage of a method of manufacturing an electrical structure, in accordance with some embodiments of the present disclosure.

Referring to FIG. 4, the first insulation layer 4 may be thinned from the first surface 41 by, for example, grinding. Thus, an upper portion of the first insulation layer 4 may be removed, and the first surface 41 of the first insulation layer 4 may be aligned with the top surface of the third layer 38 of the first MOS transistor 3 and the top surface of the third layer 38a of the second MOS transistor 3a. Thus, the top surface of the third layer 38 of the first MOS transistor 3 and the top surface of the third layer 38a of the second MOS transistor 3a may be exposed from the first surface 41 of the first insulation layer 4.

Figure 5:
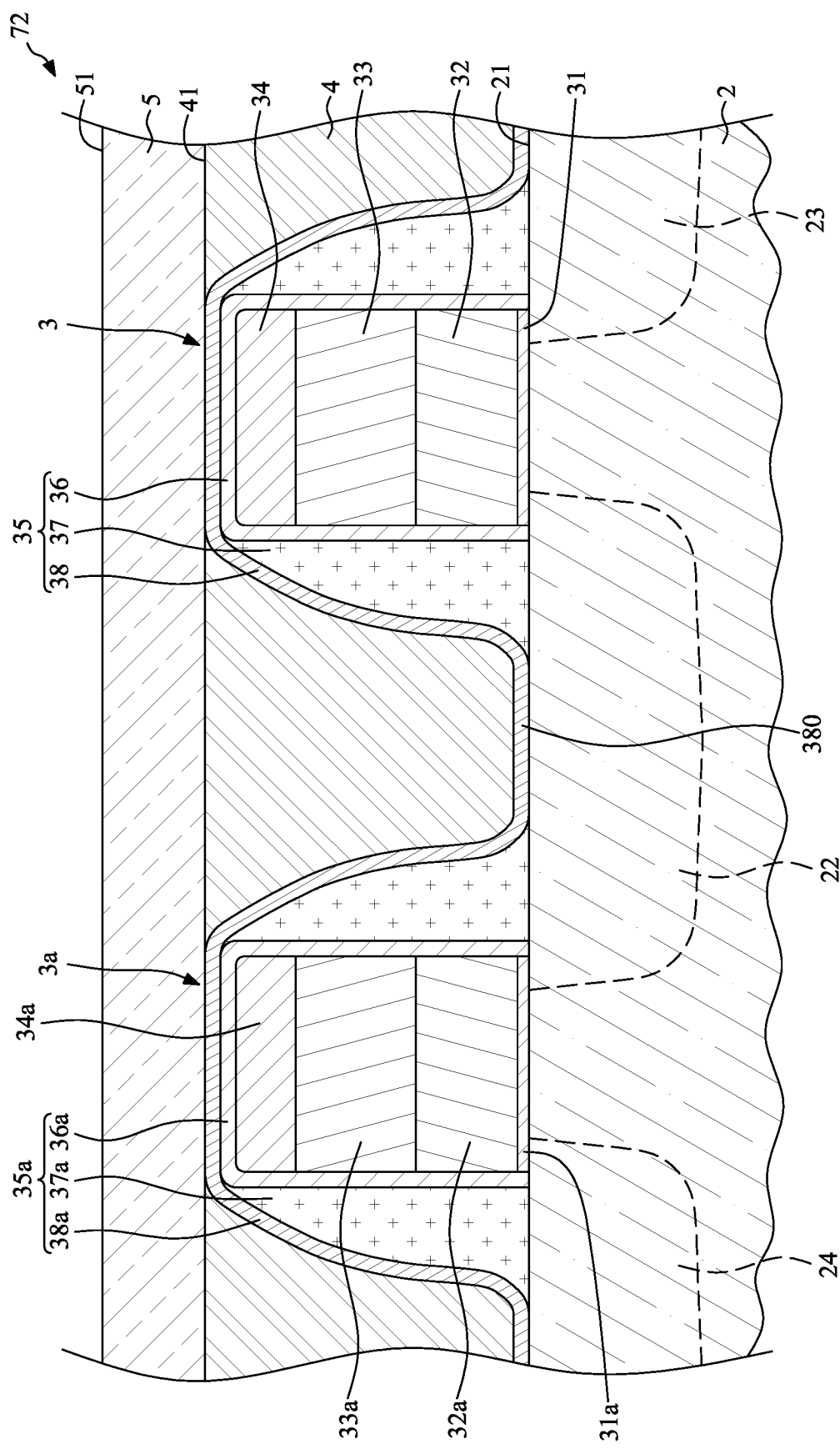
FIG. 5 illustrates one stage of a method of manufacturing an electrical structure, in accordance with some embodiments of the present disclosure.

Referring to FIG. 5, a second insulation layer 5 may be formed or disposed on the first insulation layer 4. The second insulation layer 5 may cover and contact the first surface 41 of the first insulation layer 4. Meanwhile, the stacked structure 72 may be formed. The stacked structure 72 may include the substrate 2, the first insulation layer 4 and the second insulation layer 5 stacked on one another. In addition, the stacked structure 72 may further include the first MOS transistor 3 and the second MOS transistor 3a disposed on the substrate 2 and covered by the first insulation layer 4 and the second insulation layer 5.

Figure 6:
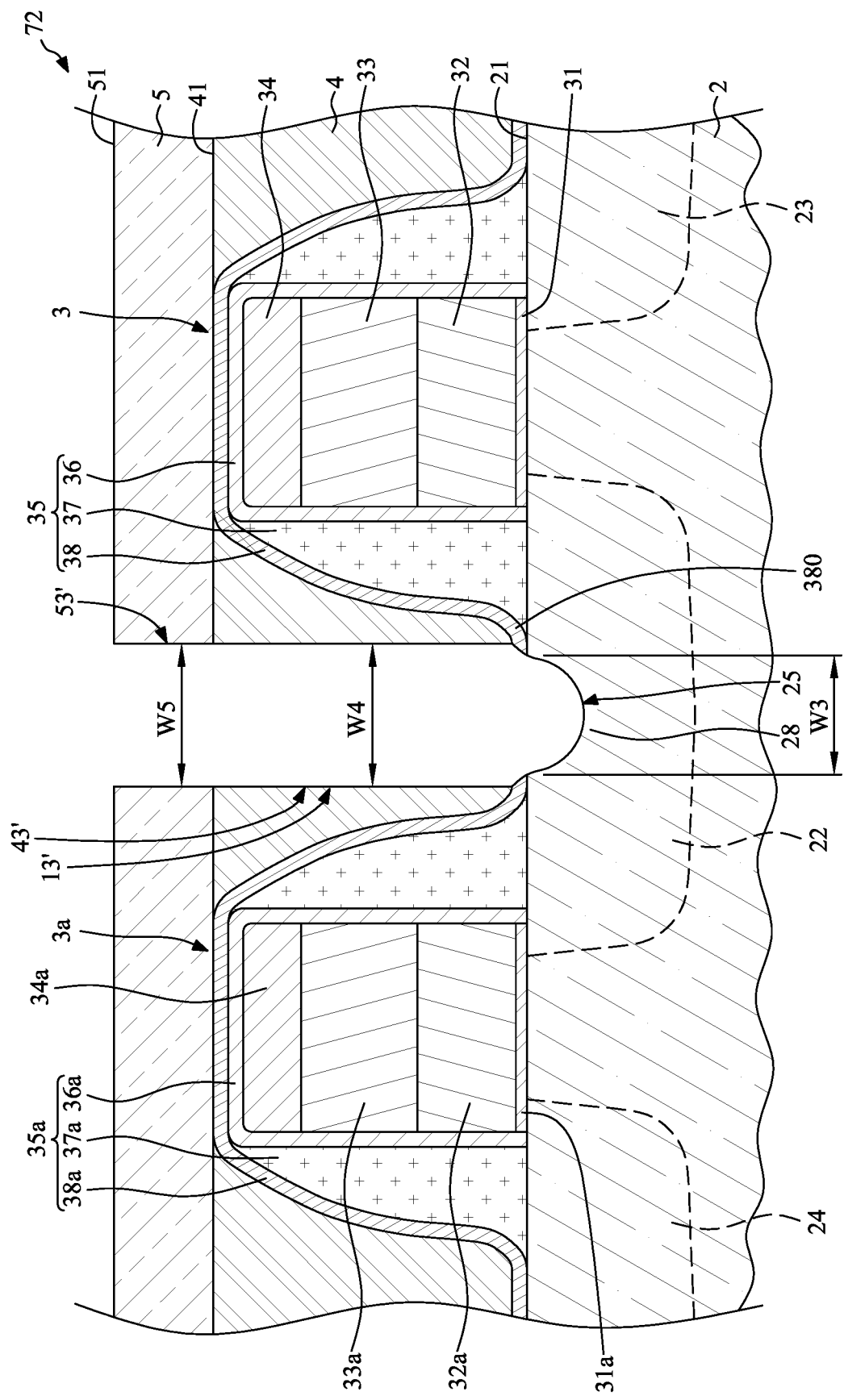
FIG. 6 illustrates one stage of a method of manufacturing an electrical structure, in accordance with some embodiments of the present disclosure.

Referring to FIG. 6, a first hole structure 13' may be formed from the first surface 51 of the second insulation layer 5 to expose a portion 28 of the substrate 2 by, for example, dry etching. The first hole structure 13' may extend through the first insulation layer 4 to form a fourth through hole 43' having a fourth width W4. The first hole structure 13' may extend through the second insulation layer 5 to form a fifth through hole 53' having a fifth width W5. The fourth width W4 may be substantially equal to the fifth width W5. The first hole structure 13' may be disposed between the first MOS transistor 3 and the second MOS transistor 3a. In some embodiments, the first hole structure 13' may further extend through the connecting layer 380 and extend into the substrate 2 to form a recess portion 25 recessed from the first surface 21 of the substrate 2. The recess portion 25 has a third width W3. The third width W3 may be the maximum width of the recess portion 25, and may be less than the fourth width W4.

Figure 7:
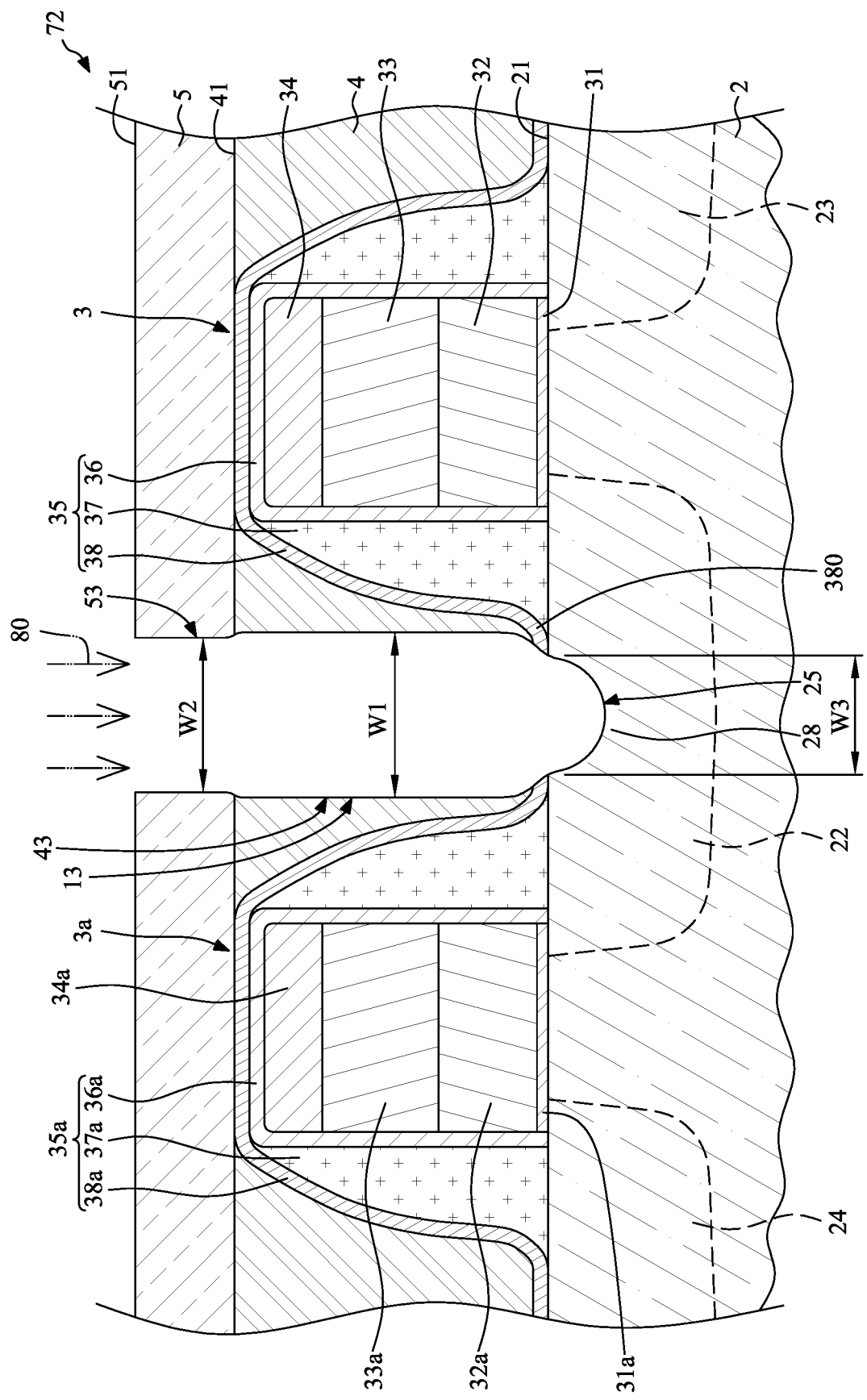
FIG. 7 illustrates one stage of a method of manufacturing an electrical structure, in accordance with some embodiments of the present disclosure.

Referring to FIG. 7, the exposed portion 28 of the substrate 2 may be cleaned through a cleaning agent 80 applied into the first hole structure 13'. Meanwhile, the cleaning agent 80 may etch the first insulation layer 4 and the second insulation layer 5 so as to enlarge the first hole structure 13' to become a second hole structure 13. Thus, the second hole structure 13 may be formed by, for example, wet etching. The cleaning agent 80 may include water and hydrofluoric acid (HF), and a weight ratio of water to HF may be between 500:1 and 2500:1. The weight ratio of water to HF may be between 1800:1 and 2200:1, between 1000:1 and 2000:1, or between 1500:1 and 2100:1. Such cleaning agent 80 may be also referred to as an "ultra dilute hydrofluoric acid (HF)".

The second hole structure 13 of FIG. 7 may be same as the hole structure 13 of FIG. 1. The second hole structure 13 may extend through the first insulation layer 4 to form a first through hole 43 (or first enlarged through hole) having a first width W1. The second hole structure 13 may extend through the second insulation layer 5 to form a second through hole 53 (or second enlarged through hole) having a second width W2. The first width W1 may be greater than the second width W2 since an etching rate of the cleaning agent 80 to the first insulation layer 4 is greater than an etching rate of the cleaning agent 80 to the second insulation layer 5.

In some embodiments, a difference between the first width W1 and the second width W2 is less than one tenth of the first width W1. That is, a ratio of (W1-W2)/W1 may be less than 0.1, 0.09, 0.08, 0.07 or 0.06. Therefore, a gap (or a tolerance) between a sidewall of the first through hole 43 and a sidewall of the second through hole 53 may be very small. The sidewall of the first through hole 43 and the sidewall of the second through hole 53 may be approximately aligned with each other.

Figure 8:
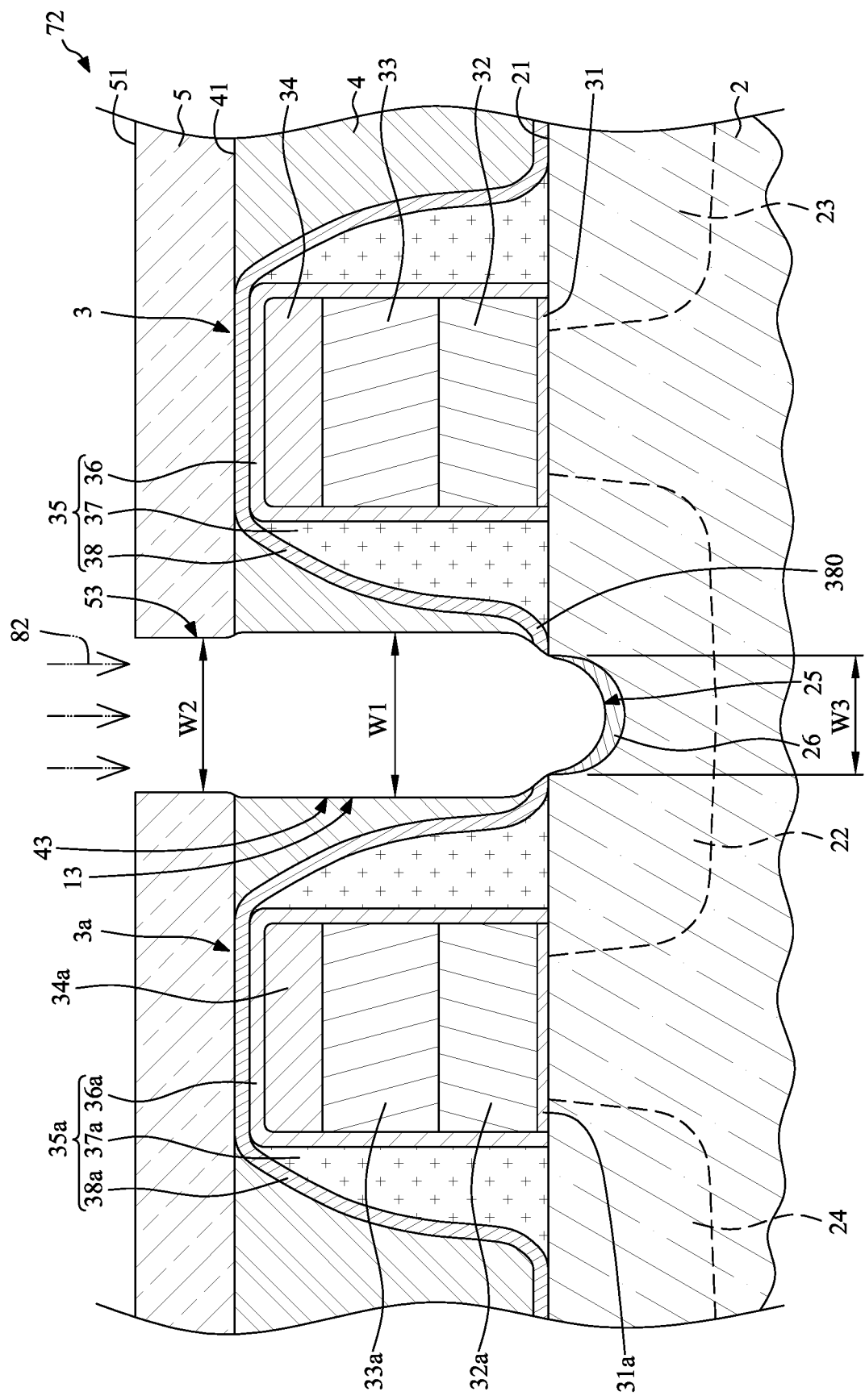
FIG. 8 illustrates one stage of a method of manufacturing an electrical structure, in accordance with some embodiments of the present disclosure.

Referring to FIG. 8, a low resistance layer 26 may be formed on the cleaned exposed portion 28 of the substrate 2 by, for example, sputtering and annealing. In some embodiments, the low resistance layer 26 is formed by sputtering cobalt (Co) 82 and then annealing, so that the low resistance layer 26 may include cobalt disilicide ($CoSi_2$). In the present disclosure, the ultra-dilute hydrofluoric acid (HF) as stated above may no influence the formation of the low resistance layer 26.

Then, the residual cobalt (Co) may be removed by, for example, wet cleaning. Then, an electrical contact 6 (FIG. 1) may be formed or disposed in the second hole structure 13 as described below.

Figure 9:
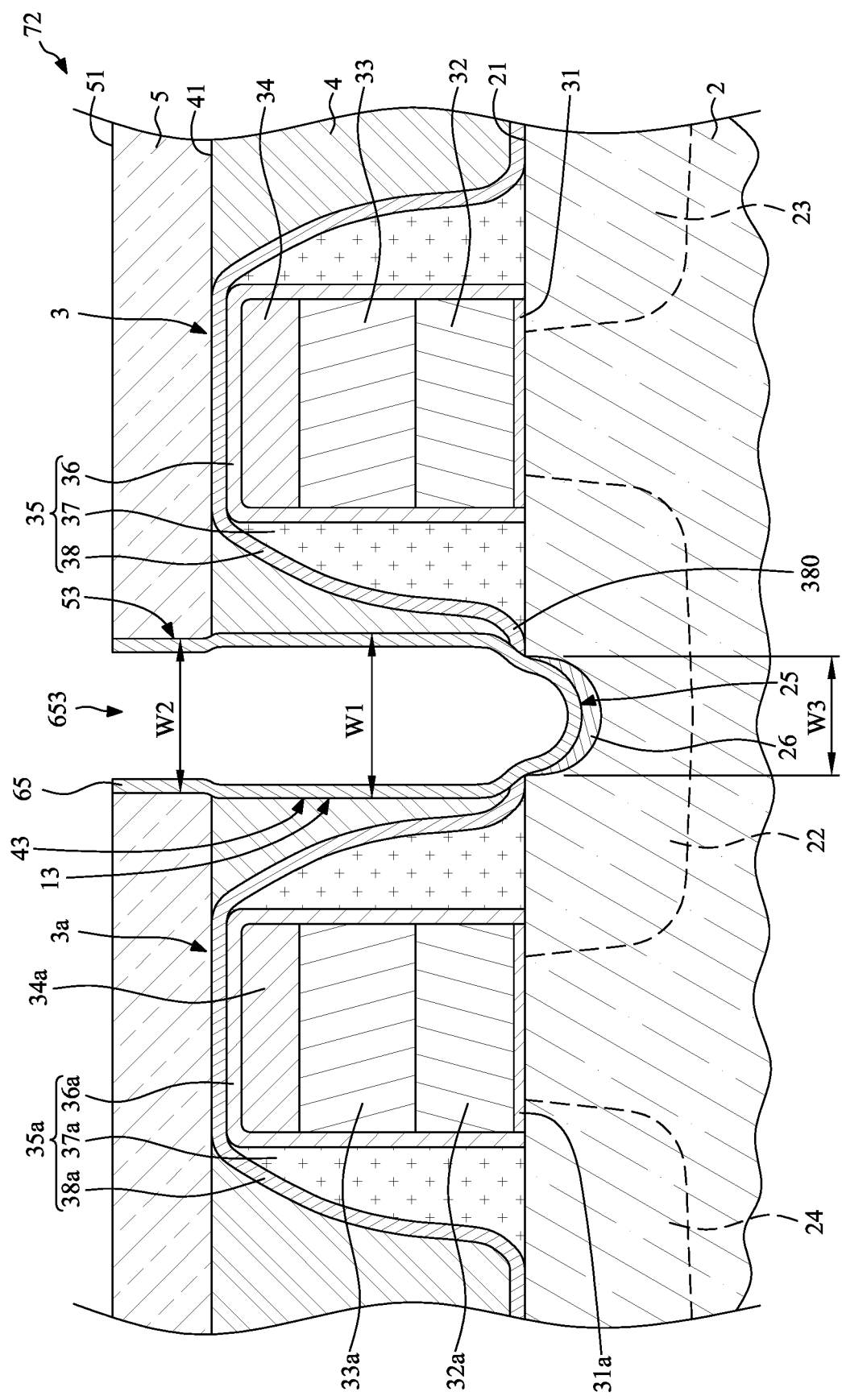
FIG. 9 illustrates one stage of a method of manufacturing an electrical structure, in accordance with some embodiments of the present disclosure.

Referring to FIG. 9, a periphery layer 65 may be formed or disposed on a sidewall of the second hole structure 13 by, for example, deposition. The periphery layer 65 may define a central hole 653. The periphery layer 65 may include titanium nitride (TiN). As shown in FIG. 7, the difference between the first width W1 of the first through hole 43 and the second width W2 of the second through hole 53 may be reduced. Thus, the sidewall of the second hole structure 13 may be substantially straight so as to facilitate the deposition process of the periphery layer 65.

Then, referring to FIG. 1, a central material 60 may fill the central hole 653 defined by the periphery layer 65 so as to form the electrical contact 6. The central material 60 may include tungsten (W). Meanwhile, an electrical structure 1 (or a semiconductor structure) may be obtained. As shown in FIG. 7, the difference between the first width W1 of the first through hole 43 and the second width W2 of the second through hole 53 may be reduced. Thus, the sidewall of the second hole structure 13 may be substantially straight so as to facilitate the filling process of the central material 60. The quality of the electrical contact 6 may be improved. That is, the seam or the crack of the electrical contact 6 may be reduced. The electrical contact 6 may be free of seaming or cracking. In addition, as shown in a result of contact resistance in wafer testing, the electrical resistance between the electrical contact 6 and the substrate 2 is still low. That is, the use of the ultra-dilute hydrofluoric acid (HF) as stated above may no influence the electrical resistance between the electrical contact 6 and the substrate 2.

Figure 10:
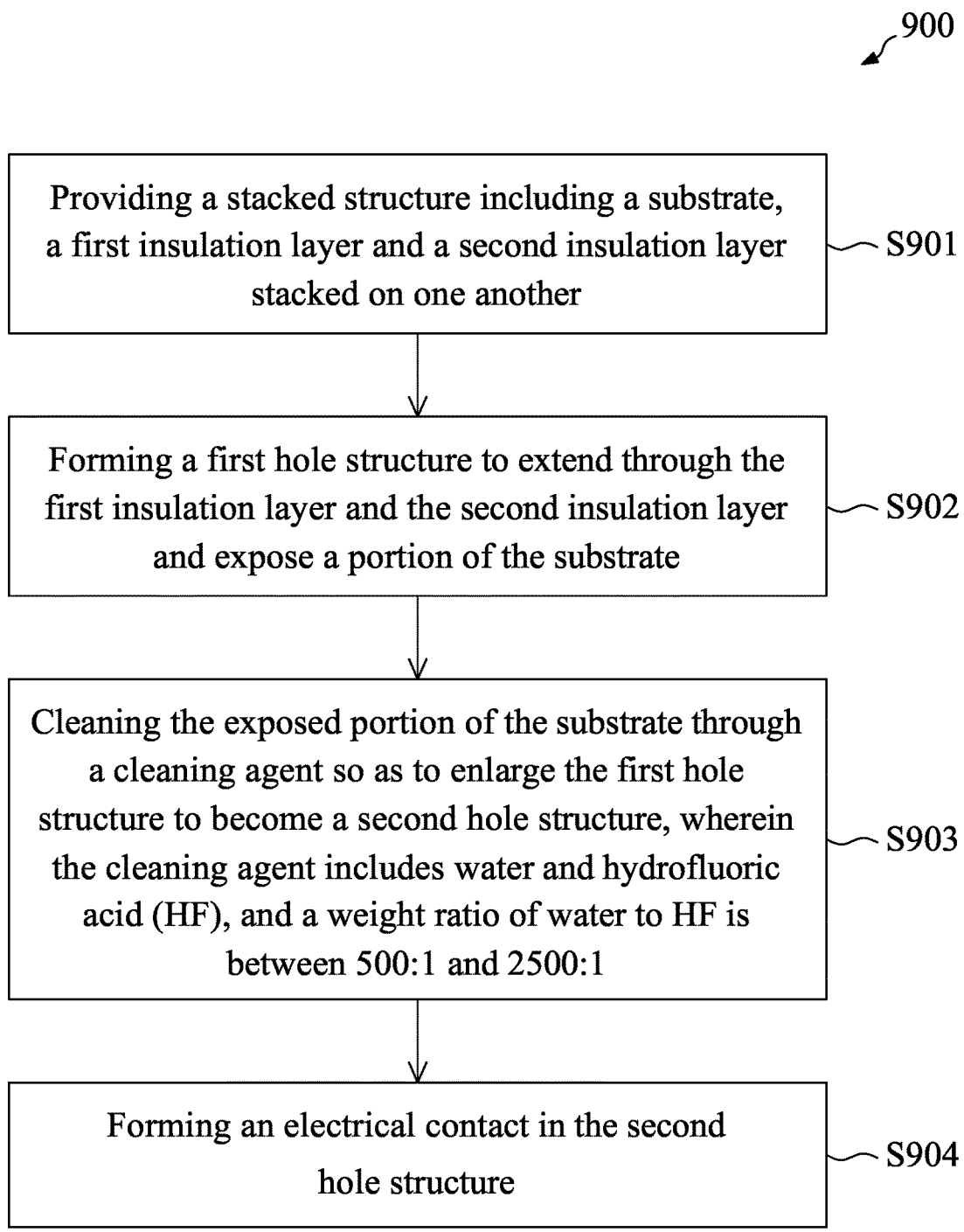
FIG. 10 is a flowchart of a method of manufacturing an electrical structure, in accordance with some embodiments of the present disclosure.

FIG. 10 illustrates a flow chart of a method 900 of manufacturing an electrical structure 1 in accordance with some embodiments of the present disclosure.

In some embodiments, the method 900 may include a step S901, providing a stacked structure including a substrate, a first insulation layer and a second insulation layer stacked on one another. For example, as shown in FIG. 5, the stacked structure 72 may be provided and may include the substrate 2, the first insulation layer 4 and the second insulation layer 5 stacked on one another.

In some embodiments, the method 900 may include a step S902, forming a first hole structure to extend through the first insulation layer and the second insulation layer and expose a portion of the substrate. For example, as shown in FIG. 6, the first hole structure 13' may be formed to extend through the first insulation layer 4 and the second insulation layer 5 and expose a portion 28 of the substrate 2.

In some embodiments, the method 900 may include a step S903, cleaning the exposed portion of the substrate through a cleaning agent so as to enlarge the first hole structure to become a second hole structure, wherein the cleaning agent includes water and hydrofluoric acid (HF), and a weight ratio of water to HF is between 500:1 and 2500:1. For example, as shown in FIG. 7, the exposed portion 28 of the substrate 2 may be cleaned through the cleaning agent 80 so as to enlarge the first hole structure 13' to become a second hole structure 13. The cleaning agent 80 includes water and hydrofluoric acid (HF), and a weight ratio of water to HF is between 500:1 and 2500:1.

In some embodiments, the method 900 may include a step S904, forming an electrical contact in the second hole structure. For example, as shown in FIG. 1, the electrical contact 6 is formed in the second hole structure 13.

One aspect of the present disclosure provides an electrical structure including a substrate, a first insulation layer, a second insulation layer and an electrical contact. The first insulation layer is disposed over a first surface of the substrate. The second insulation layer is disposed on the first insulation layer. The electrical contact extends through the first insulation layer and the second insulation layer to electrically connect the first surface of the substrate. The electrical contact includes a first portion disposed in the first insulation layer and a second portion disposed in the second insulation layer. The first portion has a first width, and the second portion has a second width. A ratio of a difference between the first width and the second width to the first width is less than 10%.

Another aspect of the present disclosure provides an electrical structure including a substrate, a first insulation layer, a second insulation layer and an electrical contact. The first insulation layer is disposed over a first surface of the substrate, and defines a first through hole extending through the first insulation layer. The first through hole has a first width. The second insulation layer is disposed on the first insulation layer and defines a second through hole extending through the second insulation layer. The second through hole has a second width. A difference between the first width and the second width is less than one tenth of the first width. An electrical contact is disposed in the first through hole and the second through hole, and is electrically connected to the first surface of the substrate.

Another aspect of the present disclosure provides a method of a stacked structure including a substrate, a first insulation layer and a second insulation layer stacked on one another. The method also includes forming a first hole structure to extend through the first insulation layer and the second insulation layer and expose a portion of the substrate. The method also includes cleaning the exposed portion of the substrate through a cleaning agent so as to enlarge the first hole structure to become a second hole structure, wherein the cleaning agent includes water and hydrofluoric acid (HF), and a weight ratio of water to HF is between 500:1 and 2500:1. The method also includes forming an electrical contact in the second hole structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electrical structure, comprising:
a substrate;
a first insulation layer disposed over a first surface of the substrate;
a second insulation layer disposed on the first insulation layer; and
an electrical contact extending through the first insulation layer and the second insulation layer to electrically connect the first surface of the substrate, wherein the electrical contact includes a first portion disposed in the first insulation layer and a second portion disposed in the second insulation layer, the first portion has a first width, wherein the first width is the width of the first portion measured at the top of the first portion, the second portion has a second width, wherein the second width is the width of the second portion measured at the top of the second portion, a ratio of a difference between the first width and the second width to the first width is less than 10%;
wherein the electrical contact further extends into the substrate;
wherein the electrical contact further includes a third portion disposed in the substrate, and
the third portion has a third width less than the first width, wherein the third width is the width of the third portion measured at the top of the substrate,
wherein a material of the second insulation layer is different from a material of the first insulation layer.

2. The electrical structure of claim 1, wherein the first portion and the second portion of the electrical contact are formed integrally and concurrently.

3. The electrical structure of claim 1, wherein the substrate includes silicon.

4. The electrical structure of claim 1, further comprising a first metal-oxide-semiconductor (MOS) transistor and a second MOS transistor disposed on the substrate, wherein the electrical contact is disposed between the first MOS transistor and the second MOS transistor.

5. The electrical structure of claim 4, wherein the electrical contact electrically connects an electrode of the first MOS transistor and/or the second MOS transistor.

6. The electrical structure of claim 1, wherein the third width is less than the second width.

7. The electrical structure of claim 1, wherein the first portion, the second portion and the third portion of the electrical contact are formed integrally and concurrently.

8. The electrical structure of claim 1, wherein the substrate includes a low resistance layer substantially conformal with the third portion of the electrical contact.

9. The electrical structure of claim 8, wherein the low resistance layer includes cobalt (Co).

10. An electrical structure, comprising:
- a substrate;
- a first insulation layer disposed over a first surface of the substrate, and defining a first through hole extending through the first insulation layer, wherein the first through hole has a first width, wherein the first width is the width of the first through hole measured at the top of the first through hole;
- a second insulation layer disposed on the first insulation layer and defining a second through hole extending through the second insulation layer, wherein the second through hole has a second width, wherein the second width is the width of the second through hole measured at the top of the second through hole, and a difference between the first width and the second width is less than one tenth of the first width; and
- an electrical contact disposed in the first through hole and the second through hole, and electrically connected to the first surface of the substrate;
- wherein the substrate defines a recess portion in communication with the first through hole, and the electrical contact is further disposed in the recess portion;
- wherein the recess portion has a third width less than the first width, wherein the third width is the width of the recess portion measured at the top of the recess portion,
- wherein a material of the second insulation layer is different from a material of the first insulation layer.

11. The electrical structure of claim 10, wherein the first through hole is communicated with the second through hole.

12. The electrical structure of claim 10, wherein the electrical contact is a monolithic structure.

13. The electrical structure of claim 10, further comprising a first metal-oxide-semiconductor (MOS) transistor and a second MOS transistor disposed on the substrate, wherein the electrical contact is disposed between the first MOS transistor and the second MOS transistor.

14. The electrical structure of claim 13, wherein the electrical contact electrically connects an electrode of the first MOS transistor and/or the second MOS transistor.

* * * * *